US 6,707,113 B1

(12) United States Patent
Kobayashi (10) Patent No.: US 6,707,113 B1
(45) Date of Patent: Mar. 16, 2004

(54) SEMICONDUCTOR DEVICE WITH CRENELLATED CHANNEL

(75) Inventor: Yasutaka Kobayashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/316,944

(22) Filed: Dec. 12, 2002

(51) Int. Cl.$^7$ ................................................ H01L 29/76
(52) U.S. Cl. ...................... 257/368; 257/314; 257/315; 257/338; 257/357; 257/408
(58) Field of Search ................... 257/314, 315, 257/338, 351, 408, 750, 754, 368; 438/211, 201, 257, 260

(56) References Cited

U.S. PATENT DOCUMENTS 6,407,423 B1 * 6/2002 Okumoto ................... 257/306

* cited by examiner

Primary Examiner—Cuong Nguyen
Assistant Examiner—Thomas Magee
(74) Attorney, Agent, or Firm—Volentine Francos, PLLC (57) ABSTRACT

A semiconductor device has a field-effect transistor with a source, drain, and channel formed in an active region surrounded by a field region. The boundary between the channel region and field region includes crenellations that reduce the effect of contaminating particles and defects. The crenellated boundary can be formed by polysilicon-buffered local oxidation of silicon, or by use of a crenellated mask pattern.

10 Claims, 10 Drawing Sheets

SEMICONDUCTOR DEVICE WITH CRENELLATED CHANNEL

BACKGROUND OF THE INVENTION

1. Field of the Invention

The present invention relates to a semiconductor device of the metal-oxide-semiconductor type, more particularly to a semiconductor device with improved resistance to defects and particle contamination.

2. Description of the Related Art

Metal-oxide-semiconductor (MOS) devices are fabricated in large quantities from wafers of crystalline silicon. Although every effort is made to keep the wafers clean during the fabrication process, it is impossible to eliminate all contamination. Typically, the fabrication facility and process are designed to eliminate contaminating particles above a specified maximum size, but wafer surfaces may still be contaminated by smaller particles. The contaminating particles may include, for example, atmospheric dust particles, particles of oxide or other dielectric materials that become detached from the walls of chemical vapor deposition apparatus, and particles of metal or other conductive materials that become similarly detached.

Aside from particle contamination, wafer surfaces may have defects in their crystalline structure. Such defects may be created by stress arising during local oxidation of the silicon surface, for example.

Particles and defects cause various problems in MOS devices. In a MOS memory device of the type in which each memory cell is a field-effect transistor with a floating gate, a particle or defect can alter the capacitive coupling ratio between the floating gate and the source, drain, or substrate of the transistor. As a result, when the memory cell is programmed or erased by transferring electrons into or out of the floating gate, the necessary programming time or erasing time is altered.

When a floating-gate memory device is programmed or erased, a plurality of memory cells may be programmed or erased simultaneously by a series of high-voltage pulses. After each pulse, the transistor threshold voltage of the memory cells is measured. High-voltage pulses are applied repeatedly until a satisfactory threshold voltage is obtained for at least one of the memory cells, or for all of the memory cells, depending on the memory architecture and the type of operation (programming or erasing) . If one of the memory cells has a defect that makes it reach the desired threshold voltage in an abnormally short or abnormally long time, then that memory cell may be left in an over-programmed, under-programmed, over-erased, or under-erased state. Alternatively, that memory cell may be left in the correct state while other memory cells are over-programmed, under-programmed, over-erased, or under-erased. The result in either case is that tests are failed and the device has to be repaired or discarded.

Other problems include leakage of data through conductive defects in the oxide films that insulate the floating gates from the substrate, and reduction of the current-driving capability of transistors if a particle or defect reduces the transistor's channel width.

SUMMARY OF THE INVENTION

An object of the present invention is to mitigate the effect of particle contamination and defects on a MOS device.

A MOS device according to the present invention has a transistor with a source and drain of a first conductive type, and a channel region of a second conductive type disposed between the source and the drain. The source, drain, and channel region are disposed in an active region surrounded by a field region providing electrical isolation. The channel region and field region have a crenellated common boundary. The crenellations are preferably at least as large as the specified maximum size of contaminating particles permitted in the process by which the MOS device is fabricated.

The crenellations may be formed by exploiting the tendency of polysilicon-buffered local oxidation of silicon to follow contours defined by polysilicon grain boundaries. The process conditions should then be selected to produce large polysilicon grains. Alternatively the crenellations may be formed by use of a crenellated mask pattern.

The crenellations reduce the effect of a contaminating particle or defect disposed at the boundary between the channel region and field region. Since the boundary was irregular to begin with, the further irregularity introduced by the particle or defect does not greatly alter the effective channel width or change the electrical characteristics of the transistor.

For a MOS memory device with floating gates, the invention improves the manufacturing yield by reducing the probability that a particle or defect will significantly alter the programming time or erasing time of a memory cell.

DETAILED DESCRIPTION OF THE INVENTION

Embodiments of the invention will now be described with reference to the attached drawings, in which like elements are indicated by like reference characters. The embodiments are MOS memory devices such as flash memory devices with floating gates.

Figure 1:
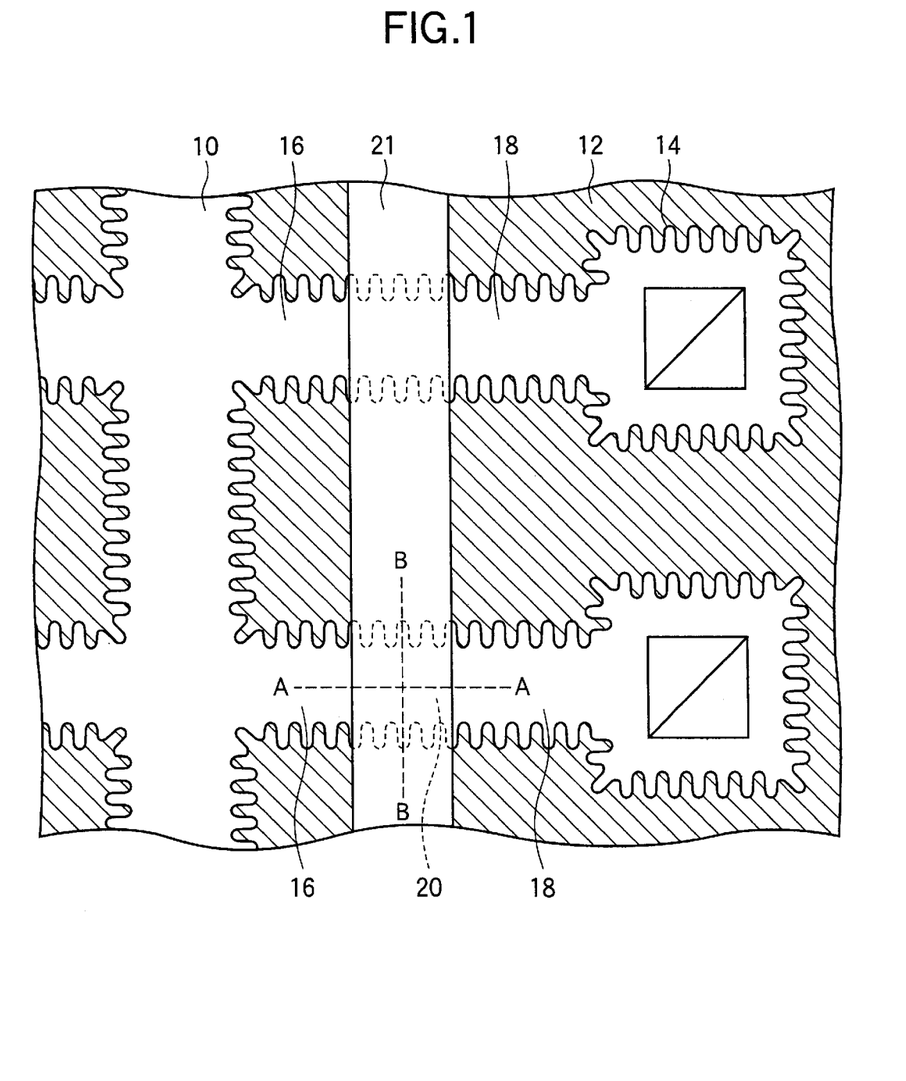
FIG. 1 is a plan view of a pair of memory cells in a memory device embodying the present invention.

Referring to FIG. 1, the memory cells in a first embodiment are field-effect transistors formed in an active region 10 surrounded by a field oxide region 12. The boundary 14 between the active region 10 and field oxide 12 is not straight as in a conventional MOS device, but has an irregular crenellated shape with a large number of indentations or crenellations. Each transistor comprises a source 16 and a drain 18 disposed on opposite sides of a control gate 20 that forms part of a word line 21. The drains 18 are connected to bit lines (not shown) oriented perpendicular to the word line 21 in a separate wiring layer. The sources 16 are mutually interconnected as shown.

Figure 2A:
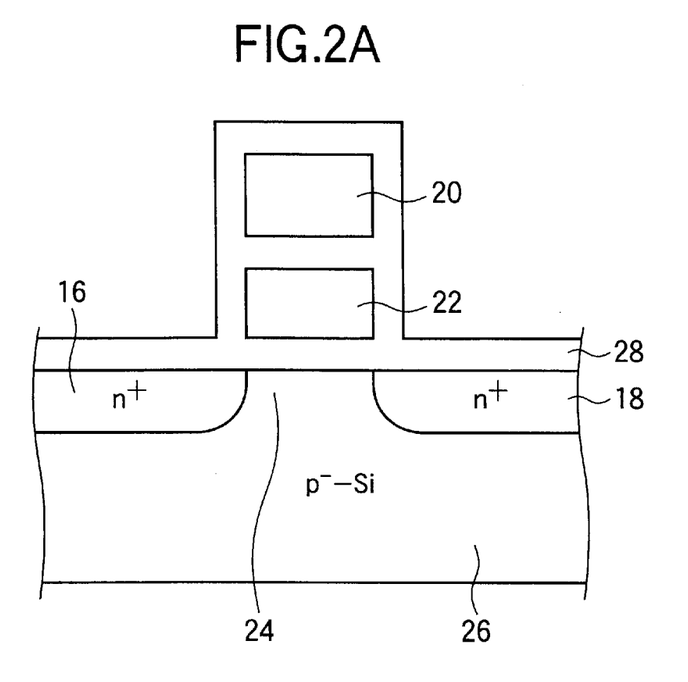
FIG. 2A is a sectional view through line A—A in FIG. 1.

Referring to FIG. 2A, each memory cell also has a floating gate 22 disposed below the control gate 20 and above a channel region 24 between the source 16 and drain 18. The channel region 24 and underlying substrate 26 are comparatively lightly doped p-type silicon semiconductor regions ($p^-$ regions). The source and drain 18 are more strongly doped n-type silicon semiconductor regions ($n^+$ regions). The control gate 20 and floating gate 22 are separated from each other and from the substrate 26 by a thin layer of silicon dioxide 28.

Figure 2B:
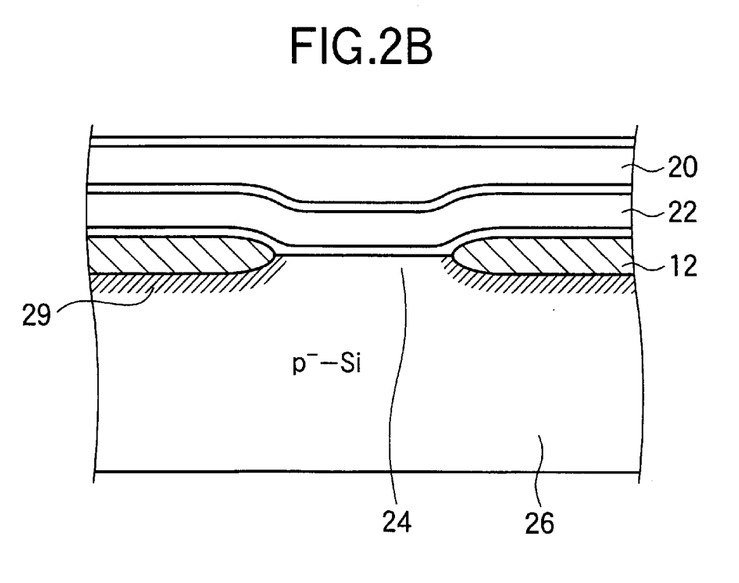
FIG. 2B is a sectional view through line B—B in FIG. 1.

Referring to FIG. 2B, a comparatively heavily doped $p^+$-type channel stop 29, indicated by hatching, is disposed in the substrate 26 below the field oxide 12 and in particular at the boundary 14 between the channel region 24 and the field oxide 12.

Next, the process by which the MOS device illustrated in FIG. 1 is fabricated will be briefly described, starting with the formation of the field oxide 12.

Figure 3A:
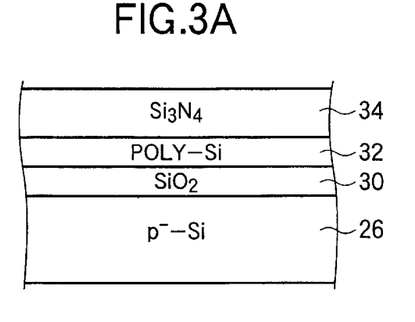
FIGS. 3A, 3C, 3E, 3G, 3I, 3K, 3M, 3O, and 3Q are sectional views through line A—A in FIG. 1 illustrating various stages in the fabrication process for the first embodiment.
Figure 3B:
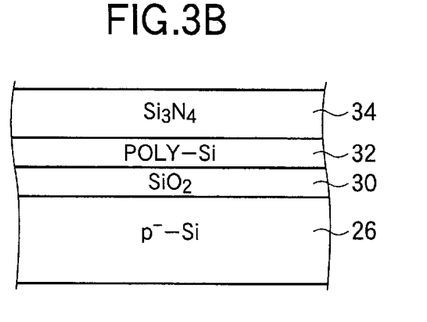
FIGS. 3B, 3D, 3F, 3H, 3J, 3L, 3N, 3P, and 3R are corresponding sectional views through line B—B in FIG. 1.

Referring to FIGS. 3A and 3B, a silicon dioxide pad layer 30, a polycrystalline silicon (polysilicon) buffer layer 32, and a silicon nitride mask layer 34 are deposited on the silicon substrate 26. The polysilicon buffer layer 32 is deposited at a temperature of at least 550° Celsius, and preferably higher than 600° Celsius, to promote the formation of large silicon crystal grains. These deposition steps are followed by an annealing step.

Figure 3C:
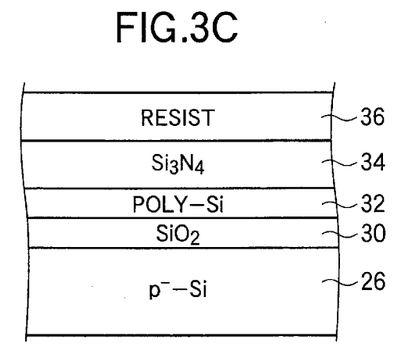
Figure 3D:
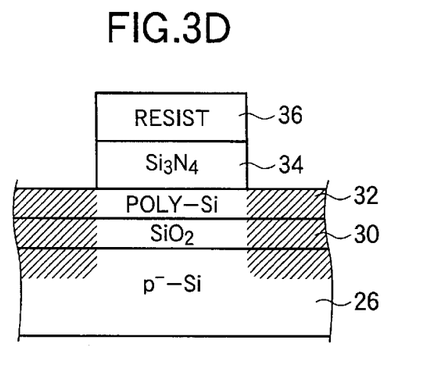

Referring to FIGS. 3C and 3D, the wafer is coated with a layer of photoresist 36. The photoresist 36 and nitride mask layer 34 are patterned by photolithography to define the active regions and field regions, and the channel stop, indicated by hatching, is implanted into the field regions.

Figure 3E:
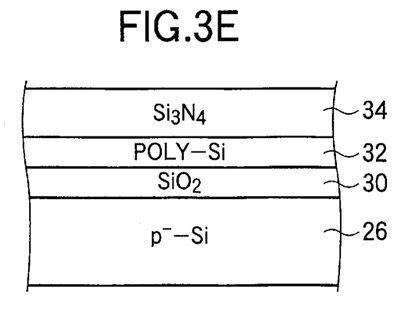
Figure 3F:
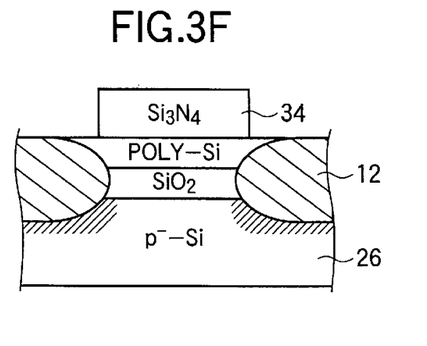

Referring to FIGS. 3E and 3F, the exposed polysilicon buffer layer 32 and the upper part of the silicon substrate 26 are oxidized in a wet oxygen atmosphere including molecular hydrogen, oxygen, and nitrogen to form the field oxide 12. During this process, referred to as local oxidation of silicon or LOCOS, oxidation proceeds laterally as well as vertically, so the field oxide encroaches beneath the silicon nitride mask 34, forming what is termed a bird's beak structure. In the polysilicon buffer layer 32, oxidation proceeds one crystalline grain at a time, so the frontier of the bird's beak tends to follow polysilicon grain boundaries, forming the crenellated shape shown in FIG. 1.

Figure 3G:
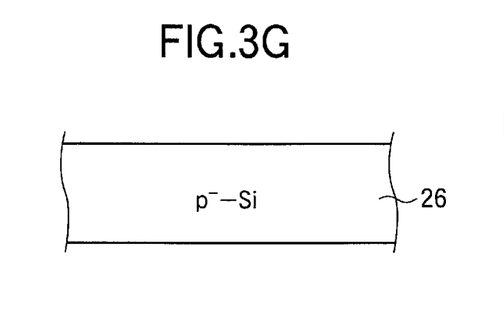
Figure 3H:
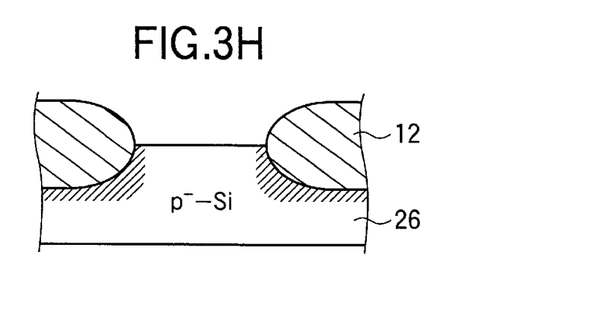

Referring to FIGS. 3G and 3H, the remaining nitride mask 34, and the underlying polysilicon buffer layer 32 and silicon dioxide pad 30, are removed by etching, exposing the substrate 26 in the active region. The steps illustrated in FIGS. 3A to 3H constitute the polysilicon-buffered LOCOS (PBL) process, also known as the poly-buffered LOCOS process or the pad-poly LOCOS (PPL) process.

Figure 3I:
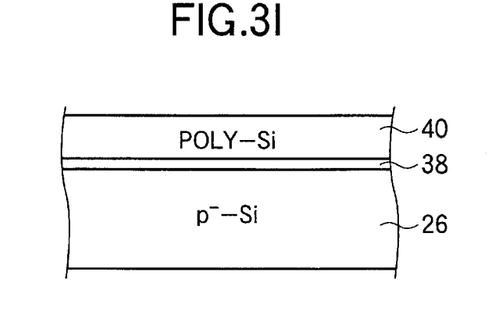
Figure 3J:
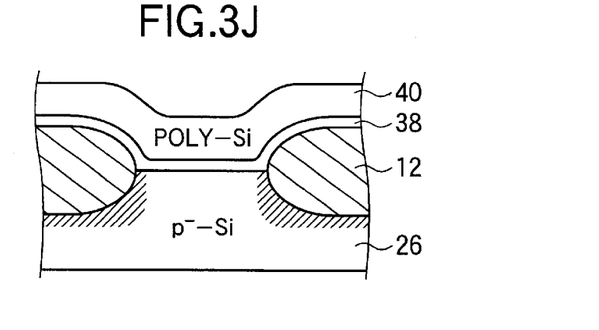

Referring to FIGS. 3I and 3J, a first gate oxide film 38 and another polysilicon layer 40 are deposited on the entire surface, covering both the field oxide 12 and the active region.

Figure 3K:
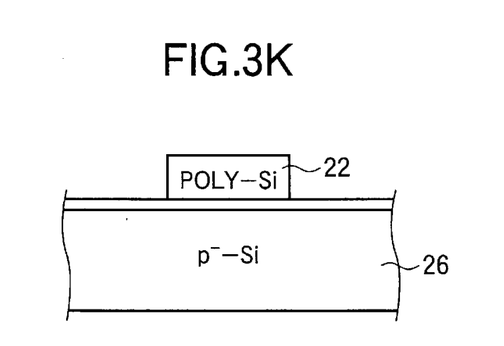
Figure 3L:
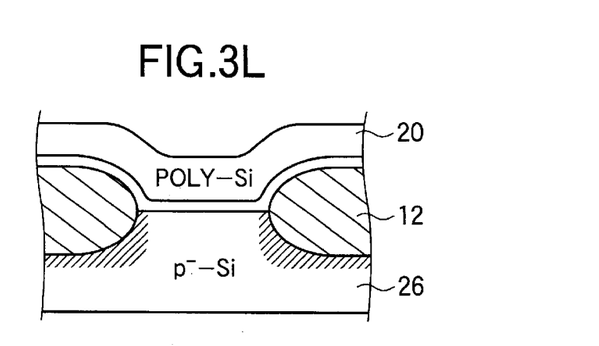

Referring to FIGS. 3K and 3L, the polysilicon layer 40 is patterned by photolithograpy and etching to form floating gates 22.

Figure 3M:
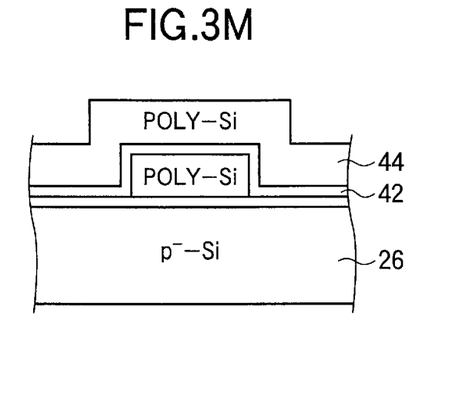
Figure 3N:
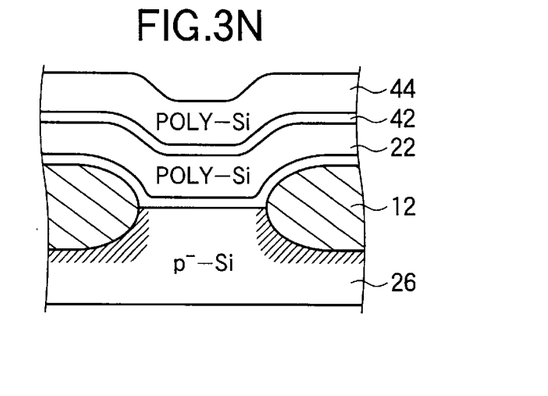

Referring to FIGS. 3M and 3N, a second gate oxide film 42 and yet another polysilicon layer 44 are deposited on the entire surface, covering the active region, the field oxide 12, and the floating gates 22.

Figure 3O:
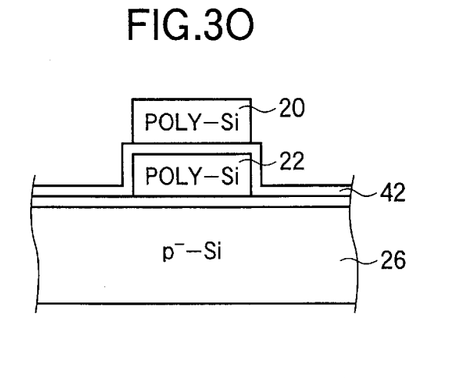
Figure 3P:
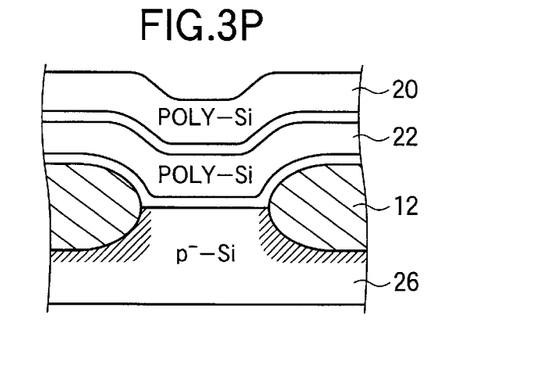

Referring to FIGS. 3O and 3P, the polysilicon layer 44 is patterned by photolithograpy and etching to form control gates 20.

Figure 3Q:
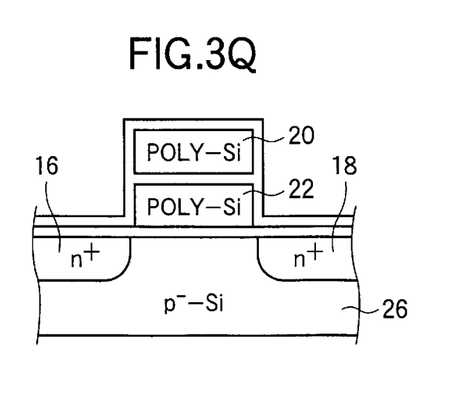
Figure 3R:
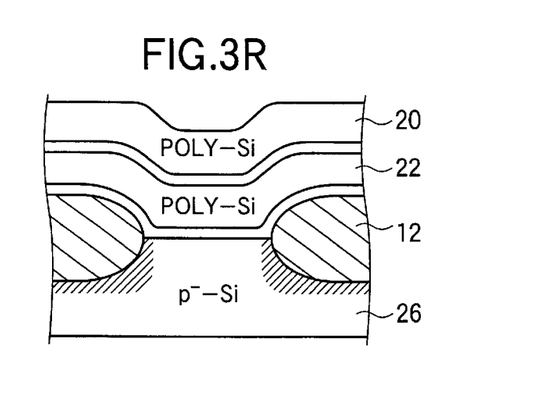

Referring to FIGS. 3Q and 3R, an n-type impurity is implanted into the active region 10 on both sides of the floating gate 22 and control gate 20 to create sources 16 and drains 18.

Other well-known processes, not illustrated, are then carried out to deposit inter-layer dielectric films, form metal interconnection wiring, and connect the metal wiring to the sources, control gates, and drains of the transistors.

The memory cells in the first embodiment are erased by applying a positive voltage such as thirteen volts (13 V) to their control gates 20, and a negative voltage such as −6 V to their sources 16 and drains 18 and the substrate 26. These voltages cause electrons to tunnel from the substrate 26 into the floating gates 22, raising the transistor threshold voltage. A memory cell in the first embodiment is programmed by applying a positive voltage such as 4 V to its drain 18 and a strong negative voltage such as −10.5 V to its control gate 20, while leaving the source 16 open and the substrate 26 grounded at 0 V. These voltages cause electrons to tunnel from the floating gate 22 to the drain 18, reducing the threshold voltage of the transistor.

Figure 4A:
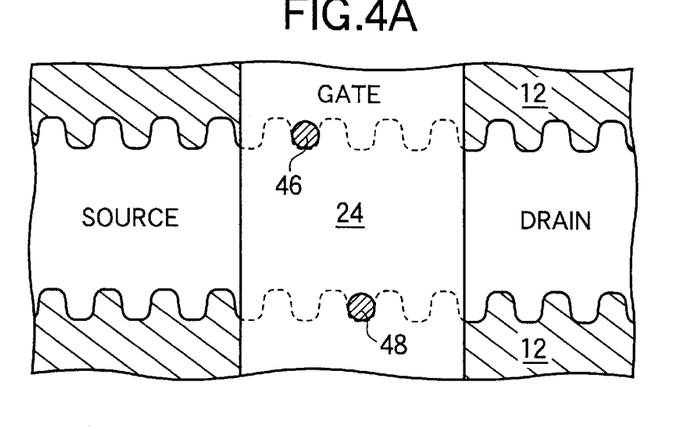
FIGS. 4A and 4B illustrate some possible locations of defects in the memory device in FIG. 1.
Figure 4B:
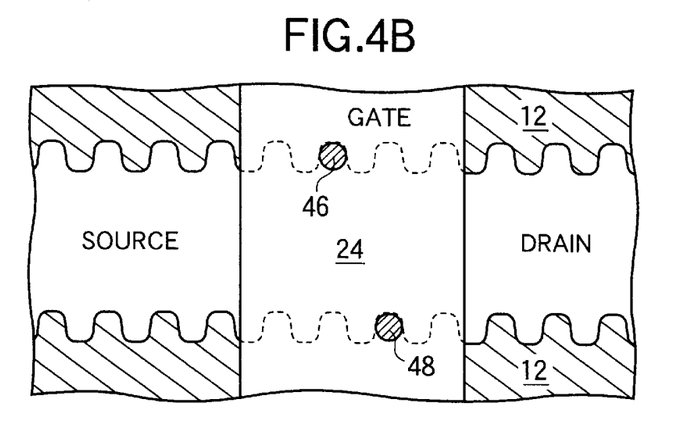
Figure 4C:
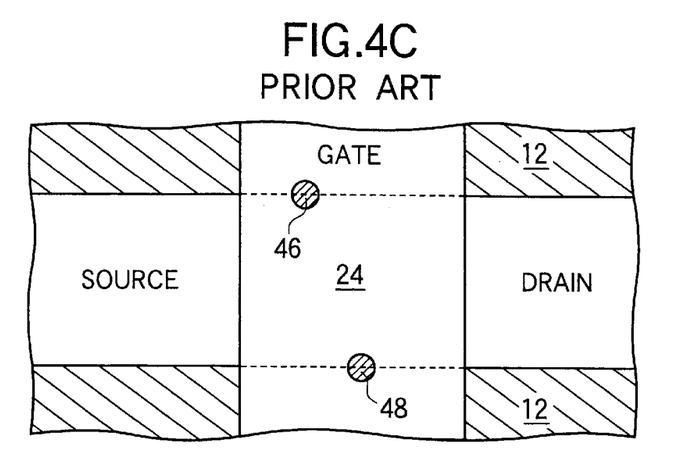
FIG. 4C illustrates defects in a conventional memory device.

The effect of the invention is illustrated in FIGS. 4A, 4B, and 4C.

In FIG. 4A, two particles of foreign matter, a dielectric particle 46 and a conductive particle 48, have settled at the boundary between the channel region 24 of a transistor and field oxide 12. The dielectric particle 46, however, is disposed in an indentation comprising field oxide material, which is also dielectric, so the presence of the particle does not alter the electrical characteristics of the transistor. Similarly, the conductive particle 48 is disposed in an indentation comprising channel-region material, which is also conductive, so the presence of this particle does not alter the electrical characteristics of the transistor either.

In FIG. 4B, the dielectric particle 46 is disposed in an indentation comprising conductive channel-region material, and the conductive particle 48 is disposed in an indentation comprising dielectric field-oxide material. Even in this worst case, the effect of the particles 46, 48 on the electrical characteristics of the transistor is mitigated because the conductivity of the channel in the boundary region near the field oxide 12 is already reduced by the crenellation of the boundary.

For comparison, FIG. 4C shows a conventional MOS transistor, in which the boundary between the channel region and the field oxide 12 is straight. A dielectric particle 46 disposed on this straight boundary significantly narrows the channel width at this point. Similarly, a conductive particle 48 disposed on the straight boundary significantly increases the channel width. Any particle or defect, located anywhere on the straight boundary, is capable of significantly affecting the electrical characteristics of the transistor.

Figure 5A:
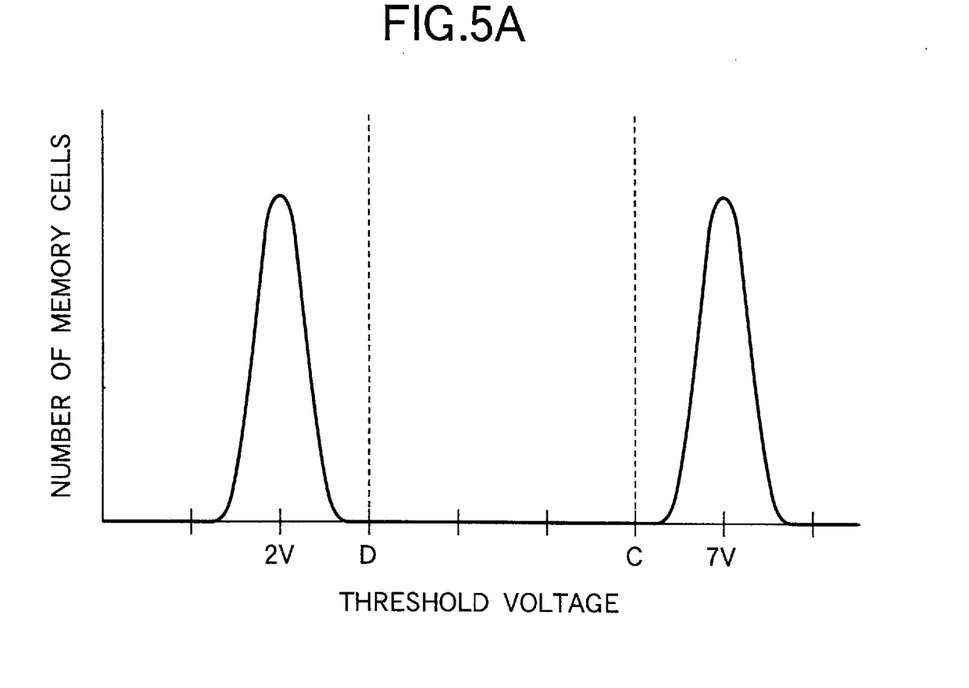
FIGS. 5A and 5B are graphs illustrating threshold-voltage distributions of memory cells in a floating-gate memory device.
Figure 5B:
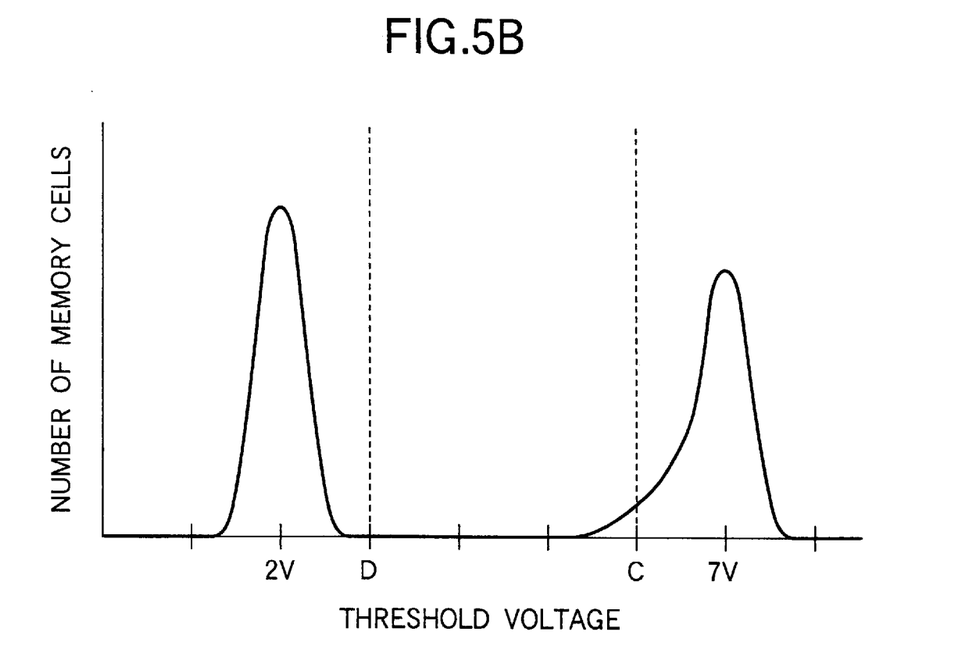

The effect of such particles and defects is illustrated in FIGS. 5A and 5B. The horizontal axis in this graphs indicates the threshold voltage of a transistor constituting a memory cell in a floating-gate memory device; that is, the voltage that must be applied to the control gate to make the transistor turn on. The vertical axis indicates the number of memory cells. Ideally, a memory cell that has been erased (stores '1' data) should have a threshold voltage of seven volts (7 V), and a memory cell that has been programmed (stores '0' data) should have a threshold voltage of 2 V. Inevitably, there is some variation in the threshold voltages, but the memory device will still operate correctly if all of the erased memory cells have threshold voltages of at least C and all of the programmed memory cells have threshold voltages not exceeding D, as illustrated in FIG. 5A. Measurements by the inventor, however, tended to produce the results illustrated in FIG. 5B; a significant number of erased memory cells had threshold voltages below the tolerance limit (C). Further investigation by the inventor showed that the cause was a particle or defect that had shortened the erase time of a memory cell, causing the erasing process to stop when this memory cell had been erased, leaving other memory cells under-erased.

Figure 6A:
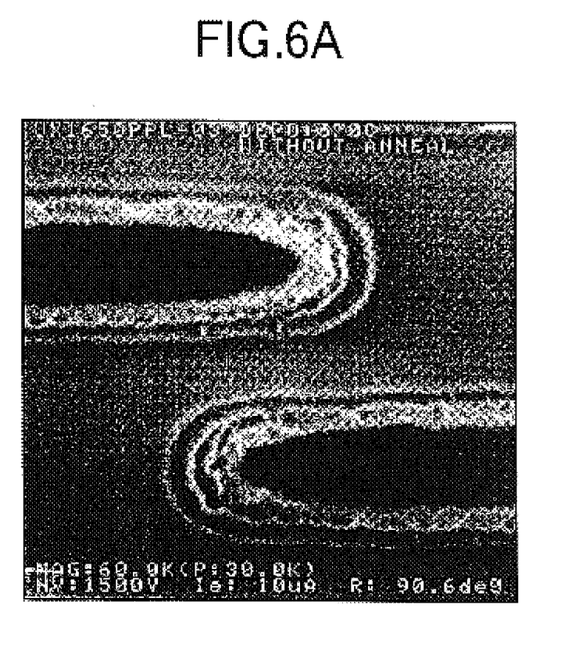
FIG. 6A shows a microscopic view of the surface of a MOS device of the type in FIG. 1 after formation of the field oxide.
Figure 6B:
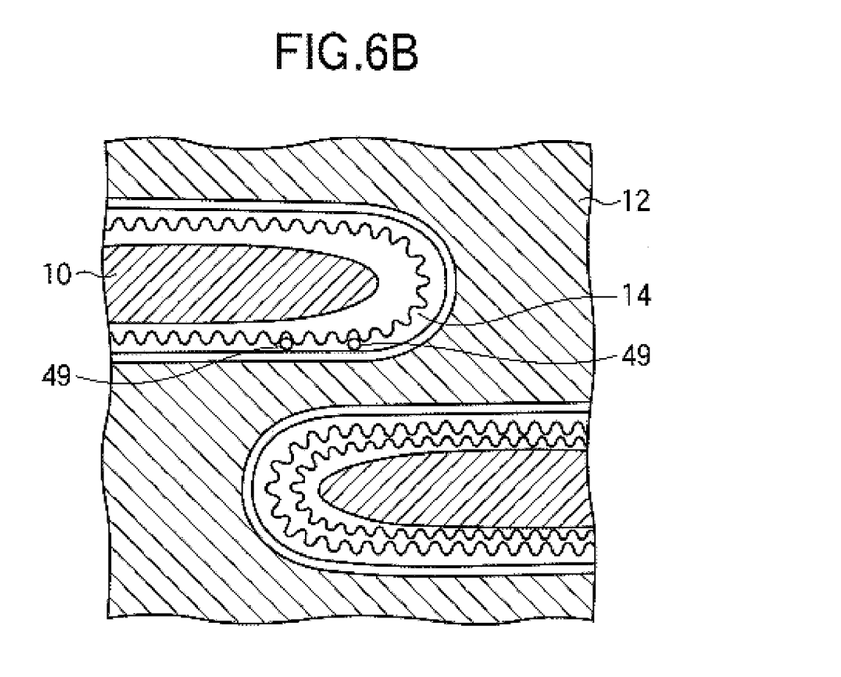
FIG. 6B is an explanatory diagram showing features in FIG. 6A.

FIG. 6A is a photocopy of an image obtained by the inventor with a scanning electron microscope showing a test device at the fabrication stage of FIGS. 3G and 3H, after the field oxide 12 has been formed. The relevant features are identified in FIG. 6B. The boundary 14 between the field oxide 12 and active region 10 has a strongly crenellated shape with many indentations due to the pronounced granular structure of the polysilicon buffer layer 32. Two defects 49 are visible at the boundary 14, but these defects become part of the crenellated structure, and do not significantly alter the crenellated shape of the active region 10.

In the polysilicon-buffered LOCOS process, the formation of a bird's-beak is normally considered undesirable. The temperature at which the polysilicon buffer layer 32 is deposited, and the temperature of the subsequent annealing step, are conventionally selected so as to produce a polysilicon buffer layer 32 with a uniformly small polysilicon grain size, thereby minimizing the size of the bird's beak. In particular, the polysilicon buffer layer is conventionally deposited at a comparatively low temperature, sometimes at such a low temperature that it is deposited as an amorphous layer, the polycrystalline structure being formed during the subsequent deposition of the silicon nitride mask layer, or during the annealing step.

In contrast, in the present invention the process conditions are intentionally selected so as to produce a polysilicon buffer layer 32 with comparatively large grains, leading to the pronounced crenellations illustrated in FIGS. 1 and 6A. The size of the crenellations is preferably equal to or greater than the maximum size of particles allowed to contaminate the wafer surface during the fabrication process. As shown above, the crenellations confound the effects of foreign particles and defects, so that they are less likely to cause the threshold voltages of memory cells to be out of tolerance.

Figure 7:
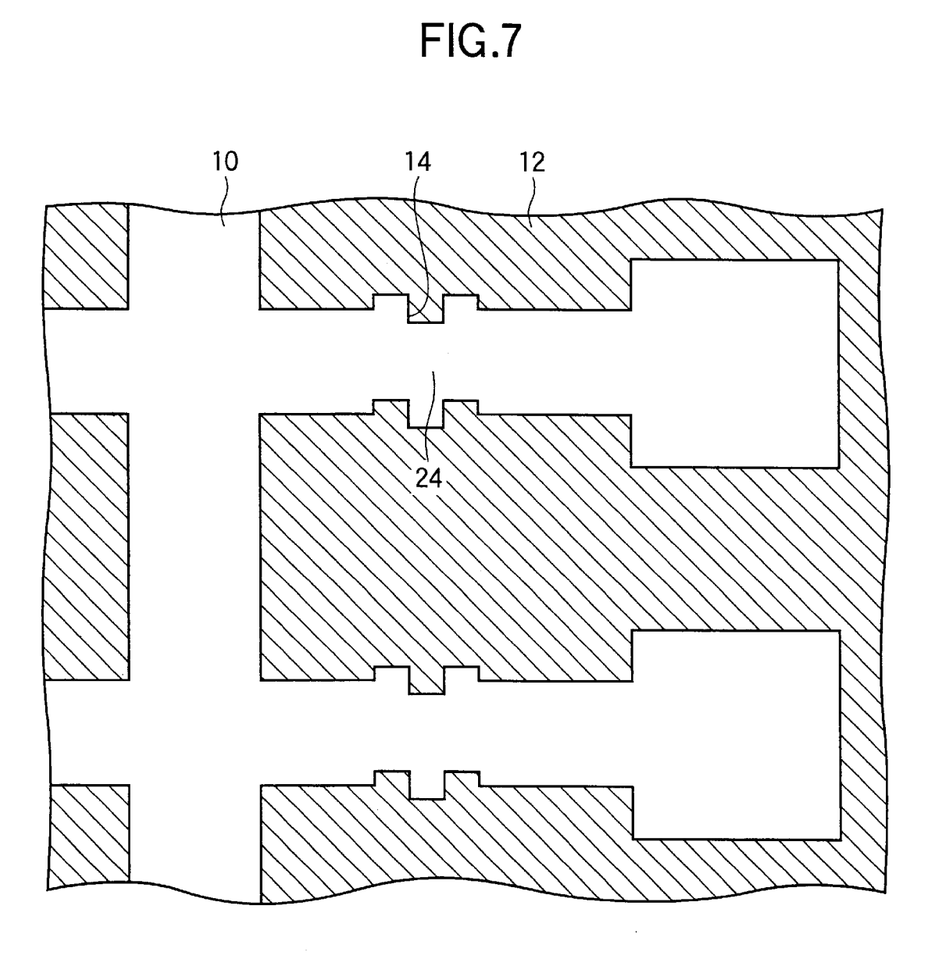
FIG. 7 is a plan view of a pair of memory cells in another memory device embodying the present invention after formation of the field oxide.

Referring to FIG. 7, a second embodiment of the invention is similar to the first embodiment, but the crenellated boundary 14 of the channel region 24 is produced by a photolithography mask having a crenellated shape. This allows the field oxide 12 to be formed by a shallow trench isolation (STI) process, for example, instead of by polysilicon-buffered LOCOS. Furthermore, the crenellations may be confined to the channel regions 24; other parts of the active region 10 need not have a crenellated boundary.

In the second embodiment, since the crenellations are defined by a photolithography mask, their size can be easily controlled. As in the first embodiment, a size equal to or greater than the maximum size of particles allowed to contaminate the wafer surface during the fabrication process is desirable. For example, it may be desirable for the indentations forming the crenellated boundary 14 to have a width and length of one tenth of a micrometer (0.1 $\mu$m) or greater.

Figure 8:
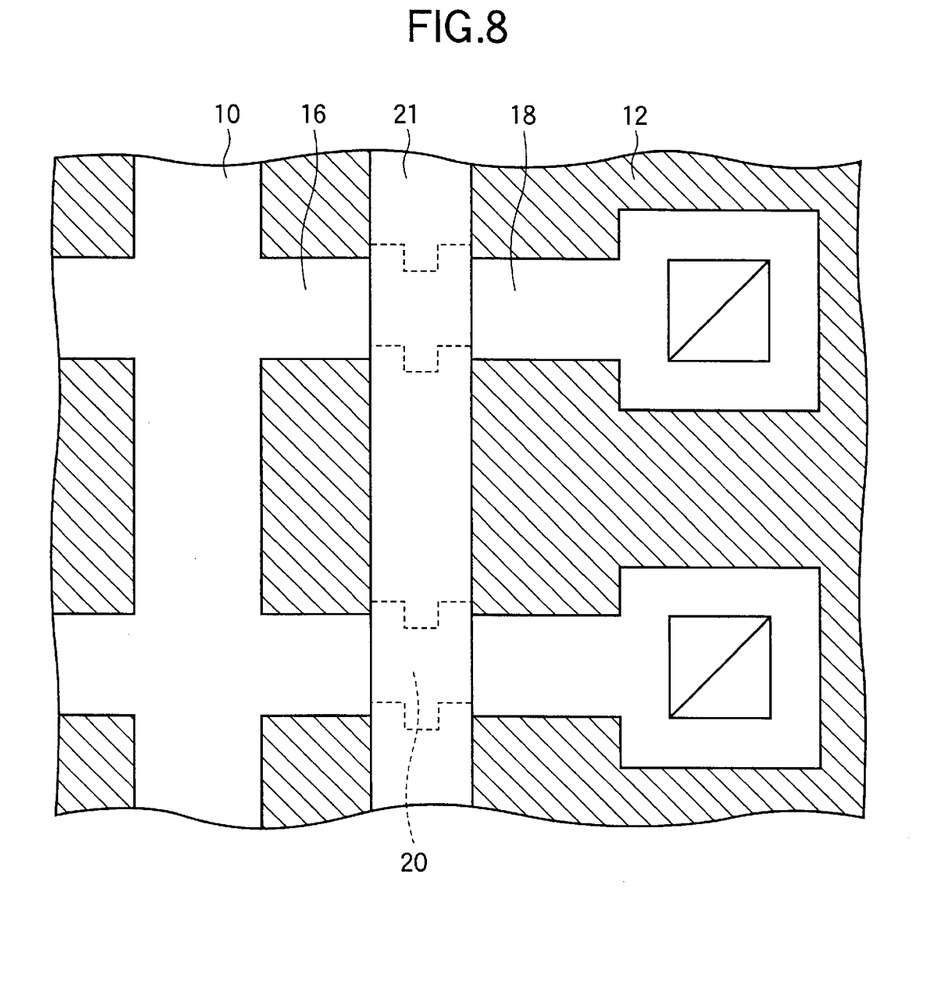
FIG. 8 is a plan view of the memory device in FIG. 7 after formation of the control gate.

FIG. 8 shows the second embodiment after formation of the sources 16, drains 18, floating gates (not visible), and control gates 20 and word lines 21.

Because the crenellations in the second embodiment are defined by a photolithography mask, they can be formed in different ways in different parts of the semiconductor wafer. Statistics on the occurrence of defects and particles in a particular semiconductor fabrication process can be obtained by well-known mapping techniques. If these statistics indicate, for example, that defects and particles tend to occur mainly near the periphery of the wafer, then the photolithography mask can be designed to provide a crenellated boundary only for channel regions near the periphery of the wafer. Similarly, the size of the crenellations can be adjusted according to mapping results.

In a variation of the second embodiment, the active regions are defined by direct writing on the wafer surface, as in electron-beam lithography, instead of by use of a mask. In this case, the positions and sizes of crenellations can be adjusted according to the results of mapping of defects and particles on individual wafers.

The effect of the invention is not limited to the reduction of variations in memory-cell programming time and erasing time. Forming transistors with crenellated channel regions can also reduce variations in such characteristics as current-driving capability, on-resistance, and propagation delay. Accordingly, although the invention has been described in relation to a floating-gate memory device, the invention is applicable to any type of MOS device.

When the invention is practiced in a floating-gate memory device, it is not necessary for the memory cells to be programmed and erased by the procedures described above. Other programming and erasing techniques can be used.

Those skilled in the art will recognize that further variations are possible within the scope of the appended claims.

What is claimed is:

1. A metal-oxide-semiconductor (MOS) device having a transistor with a source of a first conductive type, a drain of the first conductive type, and a channel region of a second conductive type disposed between the source and the drain, the source, the drain, and the channel region being disposed in an active region, the active region being surrounded by a field region for electrical isolation, wherein the channel region and the field region have an crenellated common boundary.

2. The MOS device of claim 1, wherein the MOS device is manufactured by a process having a specified maximum size of contaminating particles, and the crenellated common boundary has indentations at least as large as the specified maximum size.

3. The MOS device of claim 2, wherein the indentations are at least one-tenth of a micrometer in width and length.

4. The MOS device of claim 1, wherein all parts of the boundary between the active region and the field region are crenellated.

5. The MOS device of claim 4, wherein the field region is formed by polysilicon-buffered local oxidation of silicon.

6. The MOS device of claim 5, wherein the boundary between the active region and the field region has indentations formed by oxidation of individual polysilicon grains during the local oxidation of silicon.

7. The MOS device of claim 1, wherein the crenellated common boundary is created from a crenellated mask pattern.

8. The MOS device of claim 1, wherein the MOS device is an integrated circuit.

9. The MOS device of claim 8, wherein the MOS device is a memory device with floating gates.

10. The MOS device of claim 1, wherein the MOS device is one of a plurality of MOS devices fabricated on a semiconductor wafer, and the crenellated common boundary is provided according to wafer defect mapping results.

* * * * *